United States Patent
Hwang

(10) Patent No.: US 9,541,806 B2
(45) Date of Patent: Jan. 10, 2017

(54) METHOD FOR FORMING THIN FILM PATTERN

(71) Applicant: Samsung Display Co., Ltd., Yongin, Gyeonggi-Do (KR)

(72) Inventor: Jun Hwang, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 14/740,450

(22) Filed: Jun. 16, 2015

(65) Prior Publication Data

US 2016/0202532 A1 Jul. 14, 2016

(30) Foreign Application Priority Data

Jan. 13, 2015 (KR) .......................... 10-2015-0006323

(51) Int. Cl.
  *H01L 21/302* (2006.01)
  *G02F 1/1343* (2006.01)
  *H01L 51/00* (2006.01)

(52) U.S. Cl.
  CPC ....... *G02F 1/13439* (2013.01); *H01L 51/0023* (2013.01)

(58) Field of Classification Search
  CPC ................ H01L 21/31116; H01L 21/31144; H01L 51/0034; G02F 1/135; G02F 1/136; G02F 2001/1352; G02F 1/13625; G02F 2001/13625
  USPC ....... 438/706, 710, 712, 714, 717, 719, 720, 438/723, 725, 736
  See application file for complete search history.

(56) References Cited

U.S. PATENT DOCUMENTS

| | | | |
|---|---|---|---|
| 4,238,559 A | 12/1980 | Feng et al. | |
| 8,841,144 B2 * | 9/2014 | Yu | B29D 11/00634 257/E21.214 |
| 8,852,990 B2 * | 10/2014 | Chen | H01L 31/02168 438/71 |

(Continued)

FOREIGN PATENT DOCUMENTS

| | | |
|---|---|---|
| KR | 1020100050303 A | 5/2010 |
| KR | 1020120046695 A | 5/2012 |

(Continued)

OTHER PUBLICATIONS

Mingirulli et al., "Hot-Melt Inkjet as Masking Technology for Back-Contacted Cells", Photovoltaic Specialists Conference (PVSC), 2009 34th IEEE, 001065, pp. 1-5.

*Primary Examiner* — Lan Vinh
(74) *Attorney, Agent, or Firm* — Cantor Colburn LLP

(57) ABSTRACT

A method for forming a thin film pattern includes: forming a first resist pattern on a substrate; forming a second resist pattern on the substrate and the first resist pattern, forming a first metal layer overlapping an exposed portion of the substrate and exposed portions of the first and second resist patterns; removing the second resist pattern and a portion of the first metal layer, through a first lift-off process to expose portions of the substrate and the first resist pattern; forming a second metal layer overlapping portions of each of the substrate, the first resist pattern and the first metal layer; and removing the first resist pattern and the first and second metal layers, through a second lift-off process, to form first and second metal patterns from remaining portions of the first and second metal layers. The first and second resist patterns have different dissolution characteristics.

11 Claims, 6 Drawing Sheets

(56) References Cited

U.S. PATENT DOCUMENTS

| | | | | |
|---|---|---|---|---|
| 2004/0084685 A1* | 5/2004 | Yabusaki | ................. | H01S 5/22 257/95 |
| 2010/0103548 A1* | 4/2010 | Kim | ...................... | G02B 5/201 359/885 |
| 2012/0128811 A1* | 5/2012 | Shizawa | ................ | G11B 5/855 425/385 |

FOREIGN PATENT DOCUMENTS

| KR | 1020120079734 A | 7/2012 |
|---|---|---|
| KR | 10-1408181 B1 | 6/2014 |

\* cited by examiner

METHOD FOR FORMING THIN FILM PATTERN

This application claims priority to Korean Patent Application No. 10-2015-0006323 filed on Jan. 13, 2015, and all the benefits accruing therefrom under 35 U.S.C. §119, the entire contents of which are incorporated herein by reference.

BACKGROUND (a) Field

The invention relates to a method for forming a thin film pattern.

(b) Description of the Related Art

A flat panel display device is used as a display device replacing a cathode ray tube display device due to characteristics such as relative light weight and slim profile. Representative examples of the flat panel display device are a liquid crystal display ("LCD") and an organic light emitting display device ("OLED").

Such a flat panel display device includes a plurality of thin film patterns disposed on a substrate including a material such as glass, stainless steel or a synthetic resin. The plurality of thin film patterns include a wiring or an electrode including a material such as metal, a thin film including an organic material, and a thin film pattern including an organic material.

SUMMARY

In a method of manufacturing a flat panel display device, metal thin film patterns are formed such as by a photo lithography method. In such a method of forming the metal thin film patterns, a first metal material thin film layer is formed, a first photo resist pattern is formed on the first metal material thin film layer, and then, the first metal material thin film layer is etched by using the first photo resist pattern as a mask. After this, a second metal material thin film layer is formed, a second photo resist pattern is formed on the second metal material thin film layer, and then, and the second metal material thin film layer is etched by using the second photo resist pattern as a mask. That is, the first metal material thin film and the second metal material thin film of the metal thin film patterns are formed through the two separate respective process steps, which complicates a manufacturing method of the flat panel display device and undesirably increases manufacturing costs, time, etc. Therefore, there remains a demand for a simpler manufacturing process of the flat panel display device to reduce manufacturing costs, time, etc.

One or more exemplary embodiment of the invention provides a method for forming a thin film pattern, the method having advantages of simplifying a process of manufacturing the thin film pattern.

An exemplary embodiment of the invention provides a method for forming a thin film pattern, including; forming a first resist pattern on a substrate; forming a second resist pattern on the substrate and overlapping the first resist pattern on the substrate, the first and second resist patterns exposing a portion of the substrate; forming a first metal layer overlapping the portion of the substrate exposed by the first and second resist patterns, overlapping the first resist pattern and overlapping the second resist pattern; removing the second resist pattern and the first metal layer overlapping the second resist pattern, through a first lift-off process to expose a portion of the substrate overlapped by the second resist pattern and to expose a portion of the first resist pattern overlapped by the second resist pattern; forming a second metal layer overlapping portions of each of the substrate, the first resist pattern and the first metal layer which are exposed by the removed second resist pattern; and removing the first resist pattern and removing the first metal layer and the second metal layer overlapping the first resist pattern, through a second lift-off process, to form the thin film pattern including: a first metal pattern and a second metal pattern from portions of the first metal layer and the second metal layer remaining after the removing the first and second resist patterns. The first resist pattern and the second resist pattern have different dissolution characteristics from each other.

The forming the first resist pattern may include: disposing the substrate on a stage and discharging a first resist material onto a first portion of the substrate disposed on the stage, by using an inkjet head; and curing the discharged first resist material at the first portion of the substrate disposed on the stage, by using a curing device disposed under the stage.

The forming the second resist pattern may include: discharging a second resist material onto a second portion of the substrate disposed on the stage and overlapping a portion of the first resist pattern, by using the inkjet head; and curing the discharged second resist material at the second portion of the substrate disposed on the stage, by using the curing device disposed under the stage.

The first metal layer and the second metal layer may include different materials from each other.

The first metal pattern may be disposed on the substrate, and the second metal pattern may be disposed on the substrate and overlapping the first metal pattern disposed on the substrate.

The second metal pattern disposed on the substrate may contact a side surface of the first metal pattern disposed on the substrate.

In the first lift-off process, the second resist pattern may be removed by using a nonpolar solvent, and the removing the second resist pattern by using the nonpolar solvent may simultaneously remove the first metal layer overlapping the second resist pattern.

In the second lift-off process, the first resist pattern may be removed by using a polar solvent, and the removing the first resist pattern by using the polar solvent may simultaneously remove the first metal layer and the second metal layer overlapping the first resist pattern.

In the first lift-off process, the second resist pattern may be removed by using a polar solvent, and the removing the second resist pattern by using the polar solvent may simultaneously remove the first metal layer overlapping the second resist pattern.

In the second lift-off process, the first resist pattern may be removed by using a non-polar solvent, and the removing the first resist pattern by using the non-polar solvent may simultaneously remove the first metal layer and the second metal layer overlapping the first resist pattern.

According to one or more exemplary embodiment of the invention, a first resist pattern and a second resist pattern having different dissolution characteristics from each other are each formed by using an inkjet method, and a first metal pattern and a second metal pattern are formed from remaining portions of metal layers after removing portions of metal layers overlapping the first and second resist patterns, through a lift-off process. As such, a process for manufacturing a thin film pattern such as that used in a display device is simplified, as compared with a conventional process for manufacturing a thin film pattern by separately forming a first metal pattern and a second metal pattern via multiple photoresists, masks, etc.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
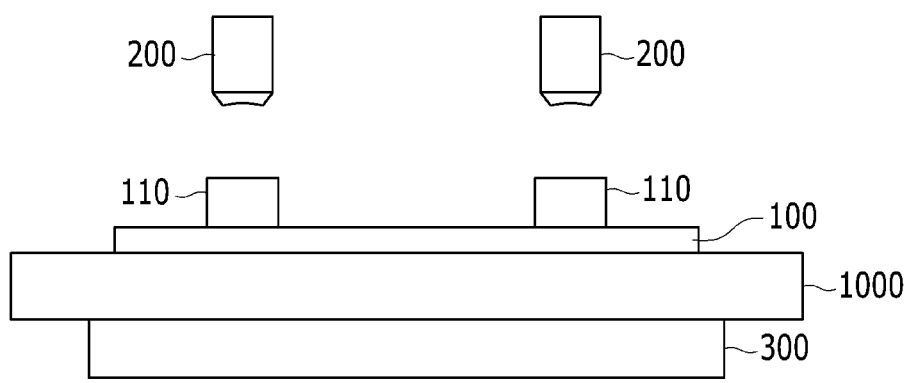
FIGS. 1 to 6 are cross-sectional views illustrating an exemplary embodiment of a method for forming a thin film pattern according to the invention.

Hereinafter, the invention will be described more fully hereinafter with reference to the accompanying drawings, in which exemplary embodiments of the invention are shown. The invention can be implemented in various different ways and is not limited to the exemplary embodiments described herein.

Portions unrelated to the description will be omitted in order to describe the invention, and similar components will be denoted by the same reference numerals throughout the present specification.

In addition, the size and thickness of each component illustrated in the drawings are arbitrary for convenience of description and the invention is not necessarily limited to the illustration.

In the drawings, the thickness of layers, films, panels, regions, etc., are exaggerated for clarity. In the drawings, for convenience of description, the thicknesses of some layers and regions are exaggerated. It will be understood that when an element such as a layer, film, region, or substrate is referred to as being "on" another element, it can be directly on the other element or intervening elements may also be present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. In addition, unless explicitly described to the contrary, the word "comprise" and variations such as "comprises" or "comprising," will be understood to imply the inclusion of stated elements but not the exclusion of any other elements. In addition, in the entire specification, the term "on" means that a component is disposed over or under a target portion, and does not necessarily mean that a component is essentially disposed on an upper portion with reference to gravity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, throughout the specification, the expression "in plane view" means viewing a target portion from above, and the expression "in cross-sectional view" means viewing a cross-section of a target portion, which is taken in a vertical direction, from a side thereof.

Hereinafter, a method for forming a thin film pattern according to the invention will be described with reference to FIGS. 1 to 6.

FIGS. 1 to 6 are cross-sectional views illustrating a method for forming a thin film pattern according to the invention.

Referring to FIG. 1, a first resist pattern 110 is formed on a substrate 100. The first resist pattern 110 is formed by an inkjet (printing) method.

The inkjet method is performed such as by using an inkjet (printing) apparatus. The inkjet apparatus includes a stage 1000, an inkjet head 200, and a baking device 300. In addition, the inkjet apparatus includes a storage tank (not shown) storing a material discharged through the inkjet head 200, and the storage tank is connected to the inkjet head 200.

The substrate 100 is disposed on the stage 1000. The inkjet head 200 is disposed on the substrate 100 and spaced a predetermined interval apart from the substrate 100 in the cross-sectional (e.g., thickness) direction. The baking device 300 is disposed under the stage 1000.

The inkjet head 200 is connected to a storage tank (not shown) storing a first resist material. The inkjet head 200 discharges the first resist material supplied from the storage tank, onto the substrate 100. The first resist pattern 110 is formed by curing the first resist material discharged on the substrate 100. The first resist pattern 110 is cured via the baking device 300.

The first resist material is discharged at a predetermined position on the substrate 100 and is cured to form the first resist pattern 110 at the predetermined position on the substrate 100 by the baking device 300 before the discharged first resist material spreads to a position outside of the predetermined position. Since the first resist material does not spread to a position outside of the predetermined position, a separate partition wall or mask for forming the first resist pattern 110 on the substrate 100 is obviated. That is, in forming the first resist pattern 110 from the discharged and cured first resist material, a process of forming the first resist pattern 110 is simplified.

Figure 2:
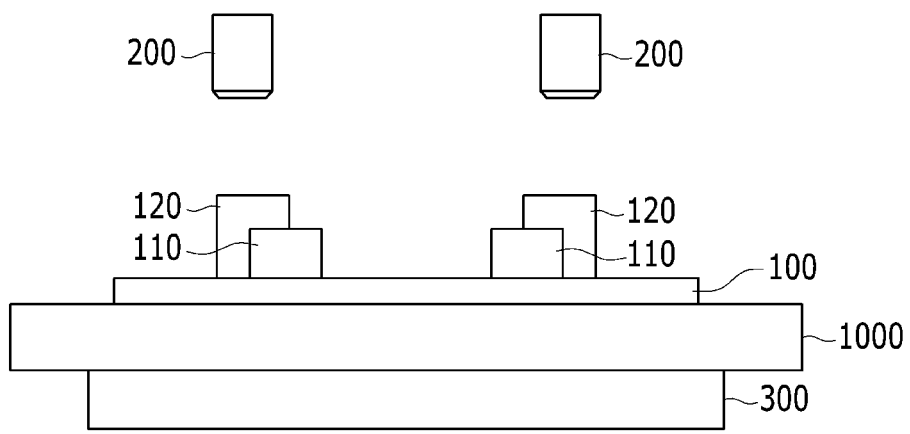

Referring to FIG. 2, a second resist pattern 120 is formed on the substrate 100 and on the first resist pattern 110. The second resist pattern 120 is formed by the inkjet method.

The inkjet head 200 discharges a second resist material on the substrate 100 including the first resist pattern 110 thereon, without moving the substrate 100 on which the first resist pattern 110 is formed. That is, the substrate 100 with the first resist pattern 110 thereon is not moved in a horizontal and/or a cross-sectional thickness direction of FIG. 2.

To discharge the second resist material on the substrate 100, the same inkjet head 200 used to discharge the first resist material may be disconnected from the storage tank (not shown) storing the first resist material and reconnected to a storage tank (not shown) storing the second resist material. In an exemplary addition, the second resist material may be discharged by using an inkjet head different from that through which the first resist material is discharged, this different inkjet head being connected to the storage tank (not shown) storing the second resist material.

The inkjet head 200 discharges the second resist material onto the substrate 100 and onto the first resist pattern 110. The second resist pattern 120 is formed by curing the second resist material discharged on the substrate 100 and onto the first resist pattern 110 via the baking device 300. The cured first and second resist patterns 110 and 120 expose portions of the substrate 100. That is, the first and second resist patterns 110 and 120 are not formed on exposed portions of the substrate 100.

Similar to that for the first resist material described above, the second resist material is discharged at a predetermined position on the substrate 100 and is cured by the baking device 300 before the second resist material spreads to a position outside of the predetermined position. Since the second resist material does not spread to a position outside of the predetermined position, a special partition wall or mask for forming the second resist pattern 120 is obviated. That is, in forming the second resist pattern 120 from the discharged and cured second resist material, a process of forming the second resist pattern 120 is simplified.

Herein, the first resist pattern 110 and the second resist pattern 120 may include an organic material In addition, the first resist pattern 110 and the second resist pattern 120 have different dissolution characteristics from each other. That is, the material used for forming first resist pattern 110 and the second resist pattern 120 may be dissolvable by different solvents. In an exemplary embodiment, the first resist pattern 110 is dissolvable by a polar solvent such as water, ethanol and acetic acid, and is not dissolvable by a nonpolar solvent such as benzene, carbon disulfide and hexane. Conversely, the second resist pattern 120 is dissolvable in the nonpolar solvent and is not dissolvable in the polar solvent.

Figure 3:
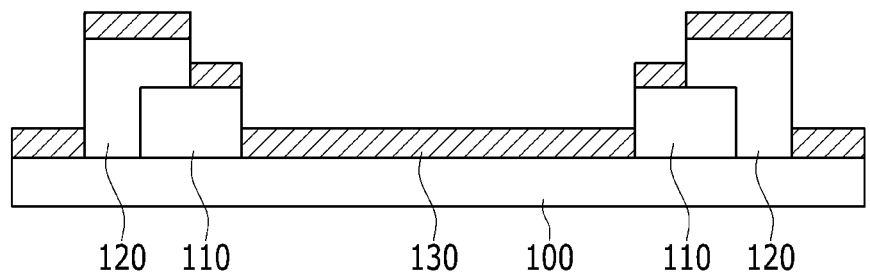

Referring to FIG. 3, a first metal layer 130 is formed on the substrate 100, the first resist pattern 110 and the second resist pattern 120. The first metal layer 130 may be disposed on an entirety of the substrate 100 including the first and second resist patterns 110 and 120 thereon.

Figure 4:
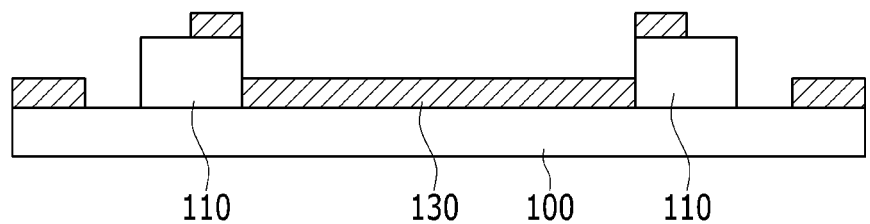

Referring to FIG. 4, the second resist pattern 120 and the first metal layer 130 formed thereon are selectively removed from the substrate 100 by performing a first lift-off process.

The second resist pattern 120 is removed from the substrate 100 by using the nonpolar solvent. The first metal layer 130 formed on the second resist pattern 120 is simultaneously removed from the substrate 100 when the second resist pattern 120 is removed from the substrate 100. Herein, since the first resist pattern 110 and the second resist pattern 120 have different dissolution characteristics from each other, the first resist pattern 110 is not removed by the nonpolar solvent. Thus, the first metal layer 130 remains only on the substrate 100 exposed by the first and second resist patterns 110 and 120, and on the first resist pattern 110. As illustrated in FIG. 4, the remaining portions of the first metal layer 130 expose surfaces of the first resist pattern 110 and the substrate 100.

Figure 5:
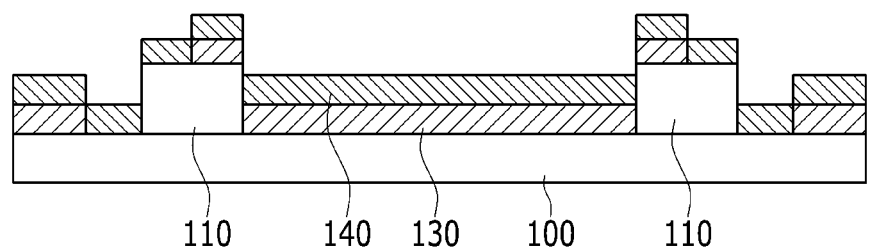

Referring to FIG. 5, a second metal layer 140 is formed on the exposed upper surface of the substrate 100, the exposed upper surface of the first resist pattern 110, and the upper surface of the first metal layer 130. Herein, the second metal layer 140 and the first metal layer 130 include different materials from each other. The second metal layer 140 may be disposed on an entirety of the substrate 100 including the remaining first resist pattern 110 and the remaining first metal layer 130.

Figure 6:
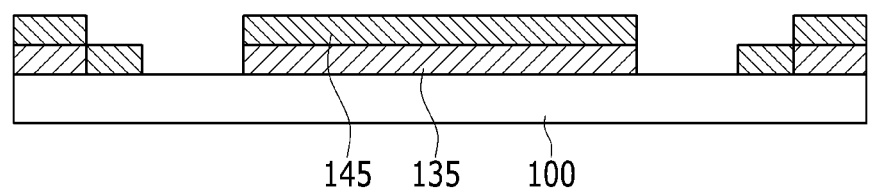

Referring to FIG. 6, the first resist pattern 110, and the first metal layer 130 and the second metal layer 140 thereon, are selectively removed from the substrate 100 by performing a second lift-off process.

The first resist pattern 110 is removed from the substrate 100 by using the polar solvent. Each of the first metal layer 130 and the second metal layer 140 formed on the first resist pattern 110 are simultaneously removed from the substrate 100 when the first resist pattern 110 is removed from the substrate 100.

Thus, a formed first metal pattern 135 and a formed second metal pattern 145 are formed on the substrate 100 from the finally remaining first and second metal layers 130 and 140. The first metal pattern 135 is formed on the substrate 100, and the second metal pattern 145 is formed on the first metal pattern 135 and on the substrate 100. Herein, the second metal pattern 145 formed on the upper surface of the substrate 100 contacts a side surface of the first metal pattern 135 formed on the upper surface of the substrate 100.

In one or more exemplary embodiment of the invention, the first resist pattern 110 and the second resist pattern 120 having different dissolution characteristics are formed by using an inkjet method. The first metal pattern 135 and the second metal pattern 145 are finally formed via performing a lift-off process on the first resist pattern 110 and the second resist pattern 120 to selectively remove portions of the first metal layer 130 and the second metal layer 140 which respectively form the first metal pattern 135 and the second metal pattern 145. As such, a process for manufacturing a thin film pattern such as that used in a display device is simplified, as compared with a conventional process for manufacturing a thin film pattern by separately forming the first metal pattern 135 and second metal pattern 145 via multiple photoresists, masks, etc.

As described above, the first resist pattern 110 is removed by using the polar solvent and the second resist pattern 120 is removed by using the nonpolar solvent, but the exemplary embodiments of the invention are not limited thereto. In an exemplary embodiment, the first resist pattern 110 may be removed by using the nonpolar solvent and the second resist pattern 120 may be removed by using the polar solvent. That is, the first resist pattern 110 is dissolvable by the nonpolar solvent and is not dissolvable by the polar solvent, and the second resist pattern 120 is dissolvable by the polar solvent and is not dissolvable by the nonpolar solvent.

In addition, the above-described exemplary embodiments of the invention form the first metal pattern 135 and the second metal pattern 145 (e.g., two metal patterns) via the lift-off processes using the first resist pattern 110 and the second resist pattern 120 (e.g., two resist patterns) having different dissolution characteristics from each other, but the exemplary embodiments of the invention are not limited thereto. In an exemplary embodiment, a third metal pattern may be additionally formed by forming a third resist pattern having a different solvent characteristic from the second resist pattern 120. For forming the third metal pattern, a third resist material is discharged at a third predetermined position on the substrate 100 including the first and second resist patterns thereon and is cured to form a third resist pattern at the third predetermined position on the substrate 100 by the baking device 300 before the discharged third resist material spreads to a position outside of the third predetermined position. Since the third resist material does not spread to a position outside of the third predetermined position, a separate partition wall or mask for forming the third resist pattern on the substrate 100 is obviated. That is, in forming the third resist pattern from the discharged and cured third resist material, a process of forming the third resist pattern is simplified. The third resist pattern and the first resist pattern 110 may have the same dissolution characteristic as each other.

By forming various metal layers on one or more of the first to third resist patterns, and by removing the one or more first to third resist patterns with a metal layer thereon, finally formed metal patterns may be formed. The metal patterns are finally formed via performing one or more lift-off processes on the resist patterns to selectively remove portions of the metal layers which respectively form the metal patterns. As such, a process for manufacturing a thin film pattern such as that used in a display device is still simplified, as compared with a conventional process for manufacturing a thin film pattern by separately forming the metal patterns via multiple photoresists, masks, etc.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A method for forming a thin film pattern, comprising:
    forming a first resist pattern on a substrate;
    forming a second resist pattern on the substrate and overlapping the first resist pattern on the substrate, the first and second resist patterns exposing a portion of the substrate;
    forming a first metal layer overlapping the portion of the substrate exposed by the first and second resist patterns, overlapping the first resist pattern and overlapping the second resist pattern, to dispose the first and second resist patterns between the first metal layer and the substrate;
    removing the first metal layer overlapping the second resist pattern and the second resist pattern disposed between the first metal layer and the substrate, through a first lift-off process to expose a portion of the substrate overlapped by the second resist pattern and to expose a portion of the first resist pattern overlapped by the second resist pattern;
    forming a second metal layer overlapping portions of each of the substrate, the first resist pattern and the first metal layer which are exposed by the removed second resist pattern; and
    removing the first resist pattern and removing the first metal layer and the second metal layer overlapping the first resist pattern, through a second lift-off process, to form the thin film pattern comprising: a first metal pattern and a second metal pattern from portions of the first metal layer and the second metal layer remaining after the removing the first and second resist patterns,
    wherein the first resist pattern and the second resist pattern have different dissolution characteristics from each other.

2. The method of claim 1, wherein the forming the first resist pattern comprises:

disposing the substrate on a stage, and discharging a first resist material onto a first portion of the substrate disposed on the stage, by using an inkjet head; and
    curing the discharged first resist material at the first portion of the substrate disposed on the stage, by using a curing device disposed under the stage.

3. The method of claim 2, wherein the forming the second resist pattern comprises:
    discharging a second resist material onto a second portion of the substrate disposed on the stage and overlapping a portion of the first resist pattern, by using the inkjet head; and
    curing the discharged second resist material at the second portion of the substrate disposed on the stage, by using the curing device disposed under the stage.

4. The method of claim 3, wherein the first metal layer and the second metal layer comprise different materials from each other.

5. The method of claim 4, wherein
    the first metal pattern is disposed on the substrate, and
    the second metal pattern is disposed on the substrate and overlapping the first metal pattern disposed on the substrate.

6. The method of claim 5, wherein the second metal pattern disposed on the substrate contacts a side surface of the first metal pattern disposed on the substrate.

7. The method of claim 6, wherein in the first lift-off process,
    the second resist pattern is removed by using a nonpolar solvent, and
    the removing the second resist pattern by using the nonpolar solvent simultaneously removes the first metal layer overlapping the second resist pattern.

8. The method of claim 7, wherein in the second lift-off process,
    the first resist pattern is removed by using a polar solvent, and
    the removing the first resist pattern by using the polar solvent simultaneously removes the first metal layer and the second metal layer overlapping the first resist pattern.

9. The method of claim 6, wherein in the first lift-off process,
    the second resist pattern is removed by using a polar solvent, and
    the removing the second resist pattern by using the polar solvent simultaneously removes the first metal layer overlapping the second resist pattern.

10. The method of claim 9, wherein in the second lift-off process,
    the first resist pattern is removed by using a non-polar solvent, and
    the removing the first resist pattern by using the non-polar solvent simultaneously removes the first metal layer and the second metal layer overlapping the first resist pattern.

11. The method of claim 1, wherein the first metal pattern formed from the remaining portion of the first metal layer and the second metal pattern from the remaining portion of the second metal layer are spaced apart from each to expose a portion of the substrate.

* * * * *